(12) United States Patent
Osajima

(10) Patent No.: US 6,501,106 B1
(45) Date of Patent: Dec. 31, 2002

(54) SEMICONDUCTOR INTEGRATED CIRCUIT DEVICE AND METHOD OF PRODUCING THE SAME

(75) Inventor: Toru Osajima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/454,997

(22) Filed: Dec. 6, 1999

(30) Foreign Application Priority Data

Dec. 8, 1998 (JP) .............................. 10-348188
Oct. 7, 1999 (JP) .............................. 11-287102

(51) Int. Cl.$^7$ .............................. H01L 27/10

(52) U.S. Cl. .............................. 257/202; 257/203

(58) Field of Search .............................. 257/202, 203

(56) References Cited

U.S. PATENT DOCUMENTS 5,986,294 A * 11/1999 Kiki et al. .............................. 257/203

* cited by examiner

*Primary Examiner*—Roy Potter
(74) *Attorney, Agent, or Firm*—Armstrong, Westerman & Hattori, LLP

(57) ABSTRACT

A semiconductor integrated circuit device in which connections within and between logic unit cells can be efficiently made is provided. Logic unit cells each including a plurality of basic cells are extended in an X-direction. To form one logic unit cell, second-layer wiring regions for making connections within the logic unit cell are formed in the X-direction, i.e., the extending direction. If there are five Y-coordinate channels, the second-layer wiring regions are formed only at one Y-coordinate channel. Second-layer wiring regions for connecting logic unit cells are also formed in the X-direction, and can be situated at any of the remaining four Y-coordinate channels.

6 Claims, 16 Drawing Sheets

FLIP-FLOP

CLOCK CIRCUIT

SEMICONDUCTOR INTEGRATED CIRCUIT DEVICE AND METHOD OF PRODUCING THE SAME

BACKGROUND OF THE INVENTION

1. Field of the Invention

The present invention generally relates to semiconductor integrated circuit devices and methods of producing the same, and, more particularly, to a wiring pattern of a wiring layer in a semiconductor integrated circuit device having aligned basic cells and logic unit cells each made up of basic cells.

In recent years, the number of gates has been increasing even further in a master-slice-type semiconductor integrated circuit device (gate array) having aligned basic cells or in a complex LSI in which basic cells do not coexist with a standard cell, a CPU core, or an analog circuit. Because of this, logic unit cells made up of basic cells are formed as many as possible in the center of such a semiconductor integrated circuit device. Such logic unit cells are connected to one another.

As the number of logic unit cells arranged in the center of a semiconductor integrated circuit device has become larger, the wiring pattern for connecting the logic unit cells has become more complicated. Because of this, the wiring operation is becoming more and more time-consuming and troublesome. Also, a large number of basic cells are often left unused, while each semiconductor integrated circuit device is becoming larger in size.

2. Description of the Related Art

As shown in FIG. 1, a plurality of basic cells 52 in a lattice arrangement in X and Y directions are formed in the center of a conventional semiconductor integrated circuit device 51. Each of the basic cells 52 has a rectangular shape, with its long side being α and its short side being β in FIG. 1.

Each of the basic cells 52 shown in FIG. 2 comprises a P$^+$-type diffused region 53, an N$^+$-type diffused region 54, and gate electrodes 55 made of polycrystalline silicon. In each of the basic cells 52, p-channel MOS transistors 56 and 57, and n-channel MOS transistors 58 and 59 are formed as shown in FIG. 3.

To form a logic unit cell such as a NAND circuit or a flip-flop, a plurality of basic cells 52 are used to retain a necessary number of transistors 56 to 59. The basic cells 52 arranged in the X-direction are connected to form a logic unit cell 61 shown in FIG. 4. Here, the X-direction is an extending direction.

To form the logic unit cell 61, connections within each basic cell 52 and between the basic cells 52 are made by first-layer wiring regions (a lower wiring layer). In a case where the first-layer wiring regions are not enough to form the logic unit cell 61, second-layer wiring regions (an upper wiring layer) 71 are used. As shown in FIGS. 4 and 5, such second-layer wiring regions 71 are formed in the Y-direction within each logic unit cell 61.

In a case where one logic unit cell 61 is connected to another logic unit cell 61 disposed in the Y-direction as shown in FIG. 5, second-layer wiring regions (the upper wiring layer) 76 extending in the Y-direction in each logic unit cell 61 are used. Such second-layer wiring regions 76 are employed so as to extend the logic unit cells 61 in the Y-direction.

The number of basic cells 52 included in each of the logic unit cells 61 varies from one another. Accordingly, as shown in FIG. 5, the positions of the second-layer wiring regions 71 formed in the X-direction in the lower logic unit cell 61 scarcely coincide with the positions of the second-layer wiring regions 71 formed in the X-direction in the upper logic unit cell 61. Also, the short side α of each basic cell 52 extends in the X-direction, and is too short to match the positions of the second-layer wiring regions 71 and 76 in the X-direction.

As a result, the second-layer wiring regions 71 hinder formation of the second-layer wiring regions 76 for connecting the logic unit cells 61 in the Y-direction. To avoid this, the logic unit cells 61 are shifted from each other in the X-direction, as shown in FIG. 4. However, by shifting the logic unit cells 61 from one another, idle spaces 80 are created, and the basic cells 52 existing within the idle spaces 80 are left unused. Accordingly, it is necessary to add more gates for those unused basic cells 52, resulting in a larger semiconductor integrated circuit device.

Furthermore, it is time-consuming and troublesome to design the wiring pattern in such a manner that the second-layer wiring regions 71 formed within each logic unit cell 61 do not hinder the formation of the second-layer wiring regions 76 for connecting the logic unit cells 61 in the Y-direction.

SUMMARY OF THE INVENTION

A general object of the present invention is to provide a semiconductor integrated circuit device in which the above disadvantages are eliminated.

A more specific object of the present invention is to provide a semiconductor integrated circuit device in which connections within each logic unit cell and between logic unit cells can be easily made without leaving any basic cell unused, and a method of producing such a semiconductor integrated circuit device.

The above objects of the present invention are achieved by a semiconductor integrated circuit device comprising: basic cells in a lattice arrangement, with one direction being an extending direction; logic unit cells each including the basic cells in the extending direction; and second-layer wiring regions formed in the extending direction within each of the logic unit cells, the second-layer wiring regions in the extending direction being fixed in predetermined positions.

Accordingly, the second-layer wiring regions for connecting the logic unit cells in the extending direction can be formed in positions other than the predetermined positions for the second-layer wiring regions within each of the logic unit cells. Thus, more flexibility can be allowed in forming the second-layer wiring regions for connecting the logic unit cells in the extending direction. Accordingly, idle spaces, i.e., the number of unused basic cells can be reduced, thereby achieving higher integration in the semiconductor integrated circuit device.

Also, the positions of the second-layer wiring regions for connecting the logic unit cells do not include any the predetermined positions, so as not to interfere with the second-layer wiring regions for making connections within each logic unit cell. Thus, the workability in designing the wiring pattern in the semiconductor integrated circuit device can be improved.

In the semiconductor integrated circuit device of the present invention, a plurality of second-layer wiring regions may be formed within each logic unit cell. In such a case, order of priority is set on the formation positions of the second-layer wiring regions within each logic unit cell. Accordingly, the second-layer wiring regions are formed in the order of priority. In this manner, it is easy to determine which formation positions are already occupied or not from the order of priority. The second-layer wiring regions for connecting the logic unit cells are formed in positions other than the formation position determined to be occupied. Thus, the workability in designing the wiring pattern in the semiconductor integrated circuit device can be greatly improved.

The above and other objects and features of the present invention will become more apparent from the following description taken in conjunction with the accompanying drawings.

DESCRIPTION OF THE PREFERRED EMBODIMENTS

The following is a description of embodiments of the present invention, with reference to the accompanying drawings.

Figure 6:
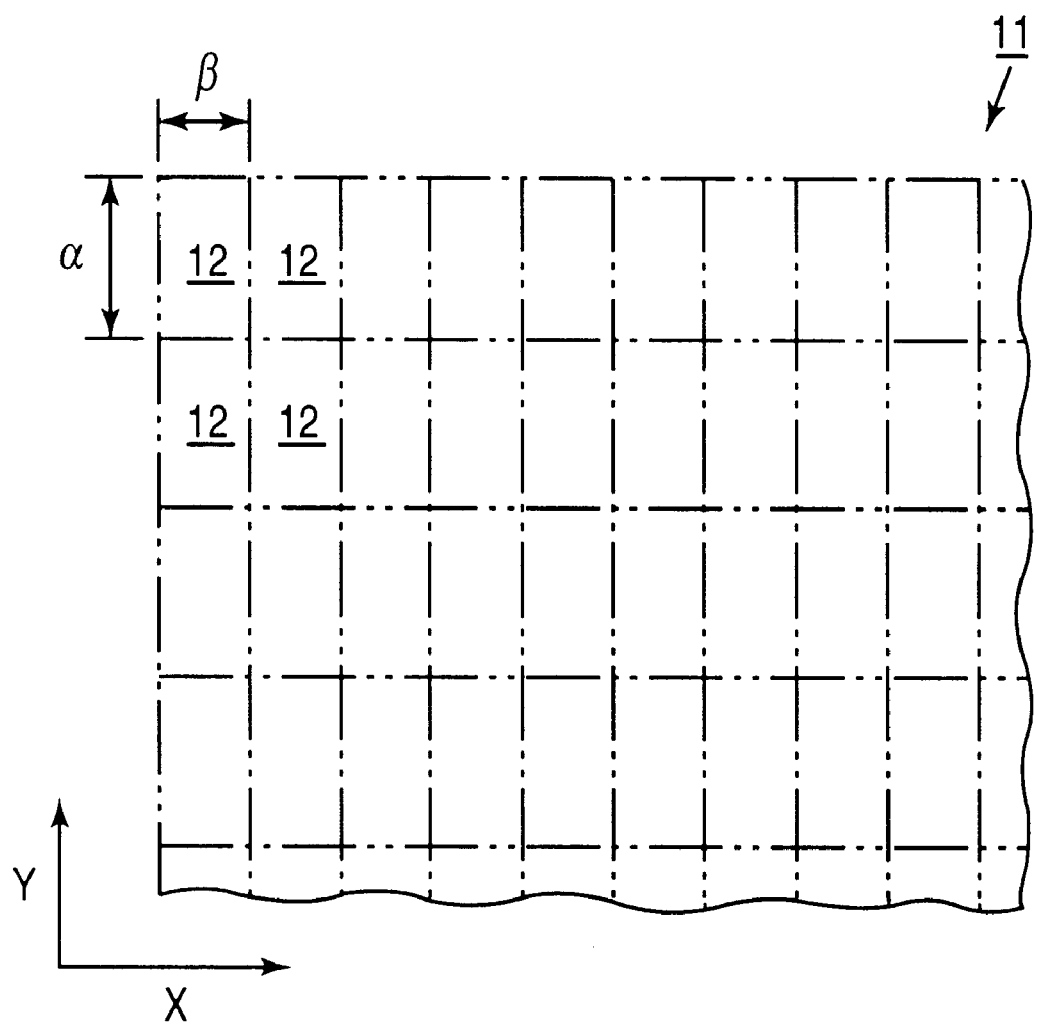
FIG. 6 is a plan view showing an arrangement of basic cells of a first embodiment of the present invention.
Figure 7:
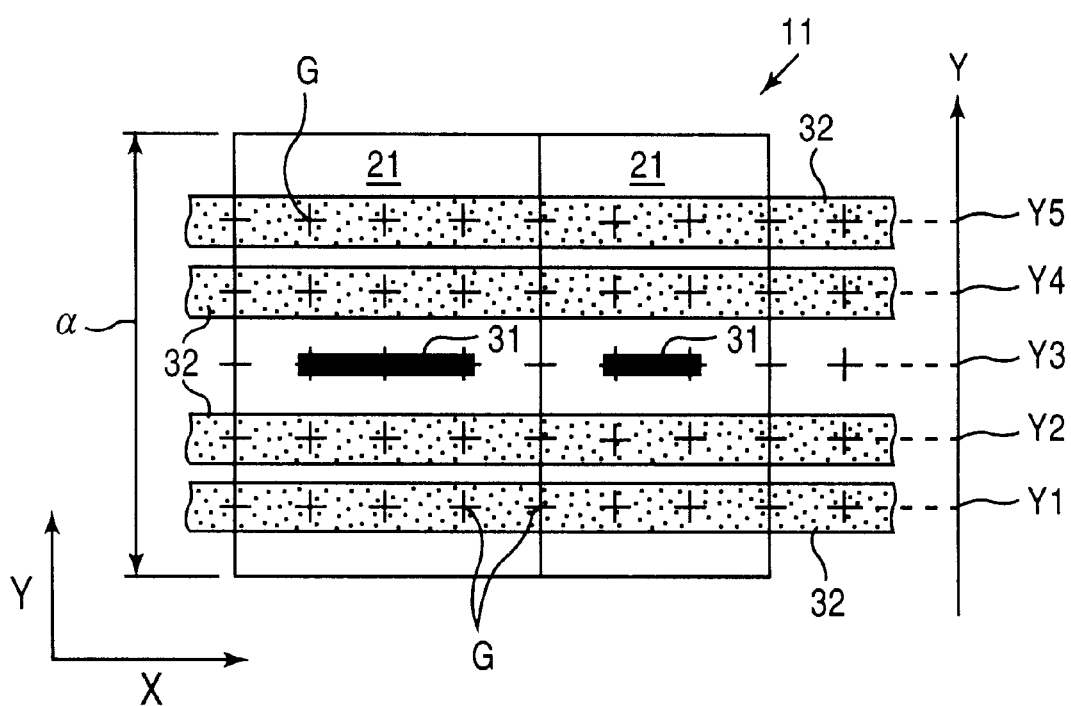
FIG. 7 is a partial plan view of a semiconductor integrated circuit device of the first embodiment of the present invention.

FIGS. 6 to 7 show a first embodiment of a semiconductor integrated circuit of the present invention. As shown in FIG. 6 in the center of a semiconductor integrated circuit device 11, a plurality of basic cells 12 are arranged in the directions of X and Y. Each one of the basic cells 12 has a rectangular shape, whose long side is indicated by "α" and whose short side is indicated by "β".

Figure 1:
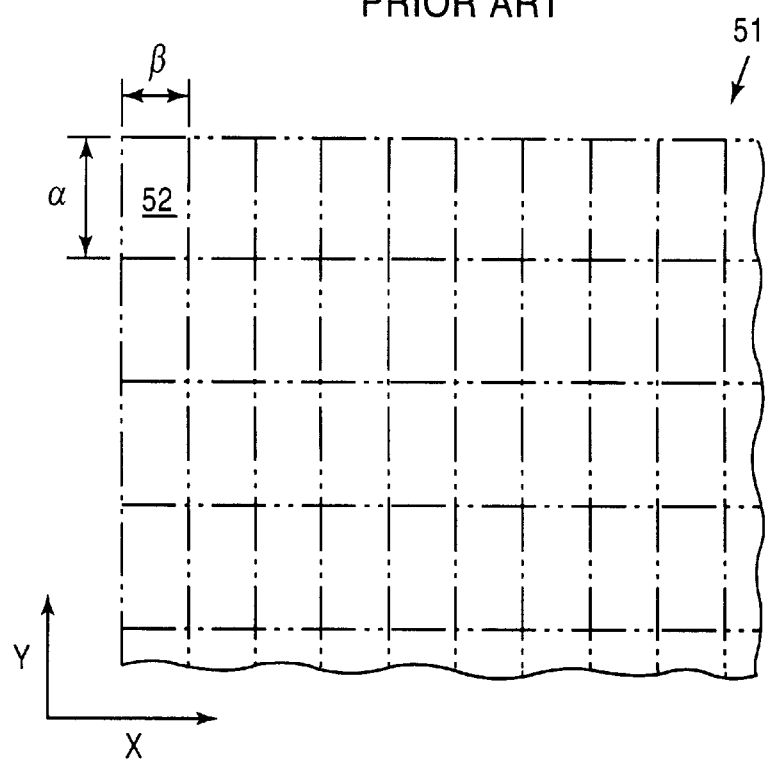
FIG. 1 is a plan view showing an arrangement of conventional basic cells.
Figure 2:
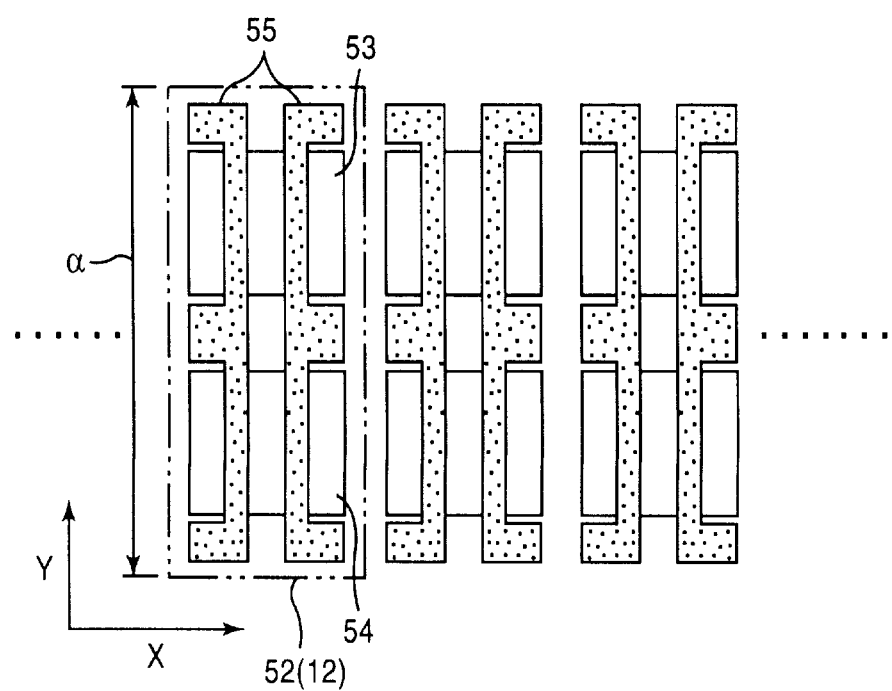
FIG. 2 is a plan view of basic cells.
Figure 3:
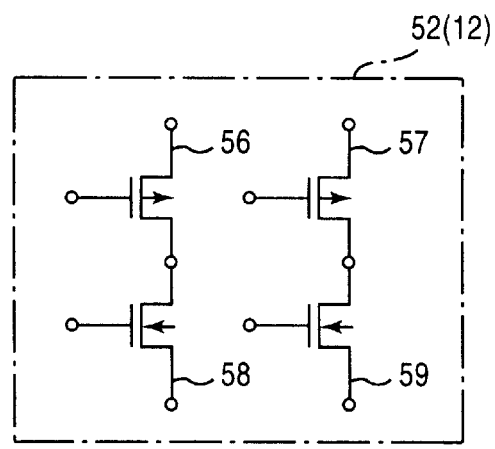
FIG. 3 is a circuit diagram of a basic cell.
Figure 4:
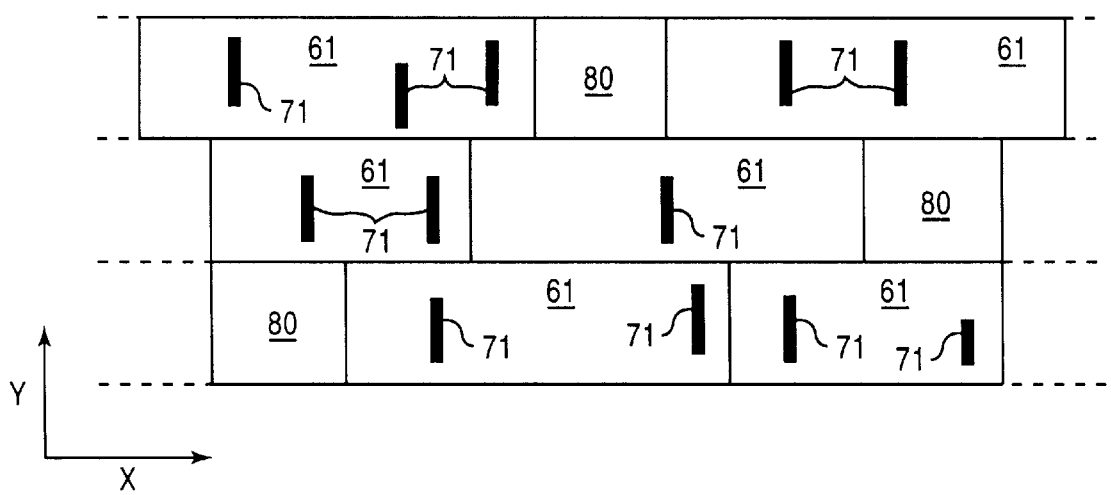
FIG. 4 is a partial plan view showing a conventional semiconductor integrated circuit device.
Figure 5:
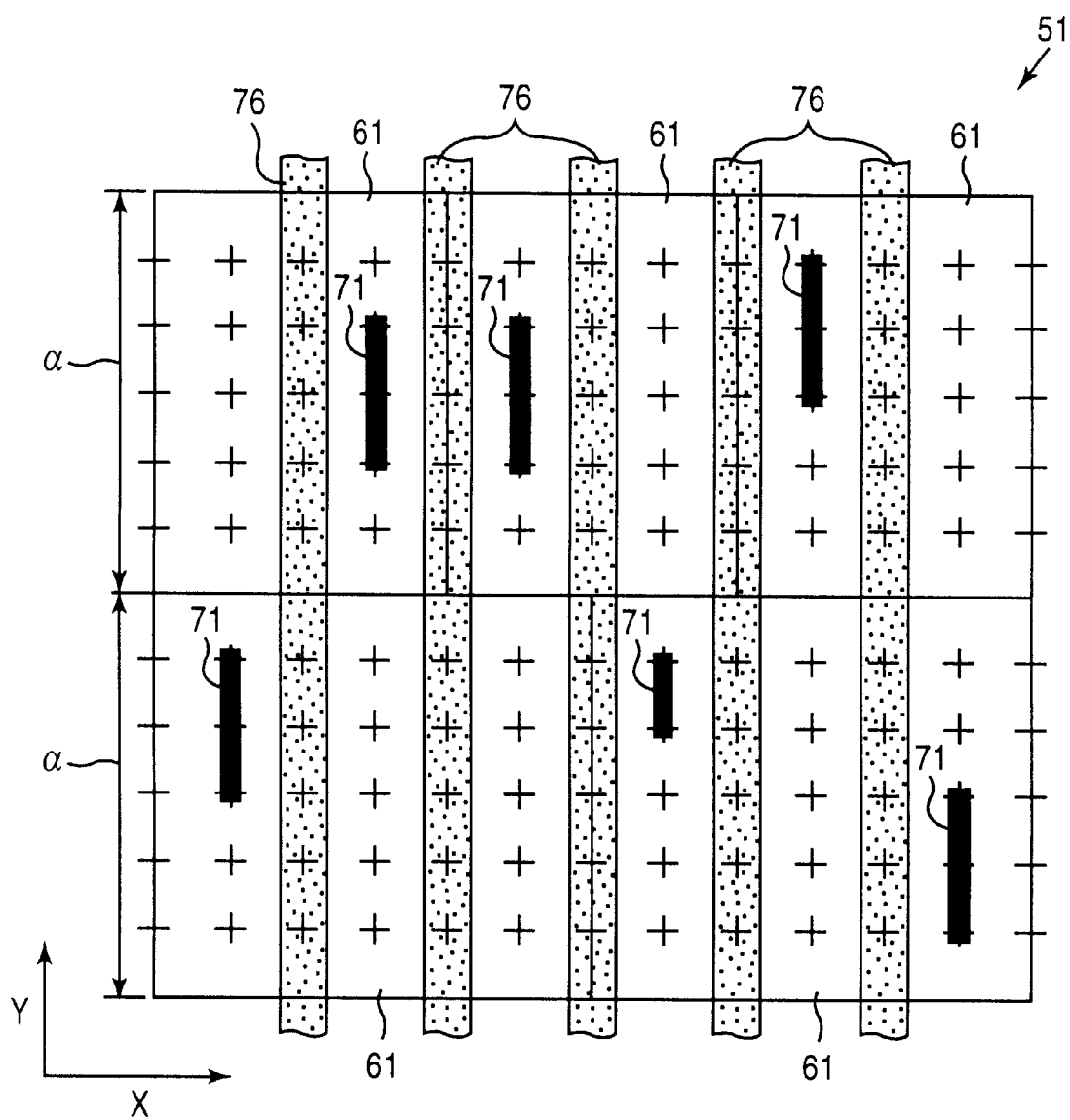
FIG. 5 is a partial plan view showing a conventional semiconductor integrated circuit device.

For ease of explanation, each of the basic cells 12 has the same structure as the basic cells 52 of the prior art. As shown in FIG. 2, each of the basic cells 12 comprises a $P^+$-type diffused region 53, an $N^+$-type diffused region 54, and gate electrodes 55 made of polycrystalline silicon. As shown in FIG. 3, two p-channel MOS transistors 56 and 57, and two n-channel MOS transistors 58 and 59 are formed in each of the basic cells 12.

Various logic unit cells 21 including NAND circuits and flip-flop circuits formed in the semiconductor integrated circuit device 11 shown in FIG. 6 are made up of a plurality of basic cells 12 so as to maintain an essential number of transistors 56, 57, 58, and 59. The X-direction is the extending direction of the logic unit cells 21, and a plurality of basic cells 12 in the X-direction are connected so as to form the logic unit cells 21 shown in FIG. 7. Also in FIG. 7, symbols "+" indicate grids G based on a design that allows essential wiring regions to align in the X-direction or the Y-direction. The positions of the grids G in the Y-direction are indicated by coordinates Y1, Y2, Y3, Y4, and Y5, for ease of explanation.

In one logic unit cell 21, connections within each of the basic cells 12 and between the basic cells 12 are made in first-layer wiring regions (a lower wiring layer). If the logic unit cell 21 cannot be formed only in the first-layer wiring regions, a second-layer wiring region (a upper wiring layer) 31 is used. As a matter of course, the second-layer wiring region 31 may also be used when the first-layer wiring regions are sufficient for the formation of the logic unit cell 21.

As shown in FIG. 7, the second-layer wiring region 31 in the logic unit cell 21 extends in the X-direction, and is situated at a coordinate Y3 in this embodiment. By determining the position of the second-layer wiring region 31 at the coordinate Y3, more flexibility is allowed to the basic cell 12 in the Y-direction.

Meanwhile, one logic unit cell 21 and another logic unit cell 21 adjacent to each other in the X-direction are connected in second-layer wiring regions (the upper wiring layer) 32 extending in the X-direction. The second-layer wiring regions 32 connecting a plurality of logic unit cells 21 extend in the X-direction across the logic unit cells 21.

The second-layer wiring regions 32 are situated at Y-coordinates Y1, Y2, Y4, and Y5.

This embodiment having the above structure has effects as follows.

1) In this embodiment, the second-layer wiring region 31 making connections within each logic unit cell 21 is located only at the Y-coordinate Y3. Accordingly, the second-layer wiring regions 32 can be situated at all the other coordinates Y1, Y2, Y4, and Y5. Thus, the second-layer wiring regions 32 connecting a plurality of logic unit cells 21 can have improved flexibility in the Y-direction.

2) In this embodiment, the logic unit cells 21 arranged in the X-direction, which is the extending direction of the logic unit cells 21, are connected. Even if the number of basic cells 12 in each logic unit cell 21 is different from one another, an extra space left between the logic unit cells 21, i.e., the number of basic cells 12 to be unused, can be reduced so as to realize a highly integrated semiconductor integrated circuit device 11.

3) In this embodiment, the second-layer wiring regions 32 connecting the logic unit cells 21 are situated at the Y-coordinates other than Y3. Accordingly, the second-layer wiring regions 32 and the second-layer wiring region 31 do not hinder each other. Thus, workability in designing can be remarkably improved.

4) In this embodiment, the second-layer wiring region 31 making connections within each logic unit cell 21 is situated only at the coordinate Y3, so as to minimize hindrance to the second-layer wiring regions 32 connecting the logic unit cells 21.

FIGS. 8 and 9A to 9C show a second embodiment of the present invention. In this embodiment, second-layer wiring regions making connections within each logic unit cell are not limited at one coordinate, but are situated at a plurality of designated coordinates. The order of priority is established on the designated coordinates, which is the different aspect from the first embodiment.

Figure 8:
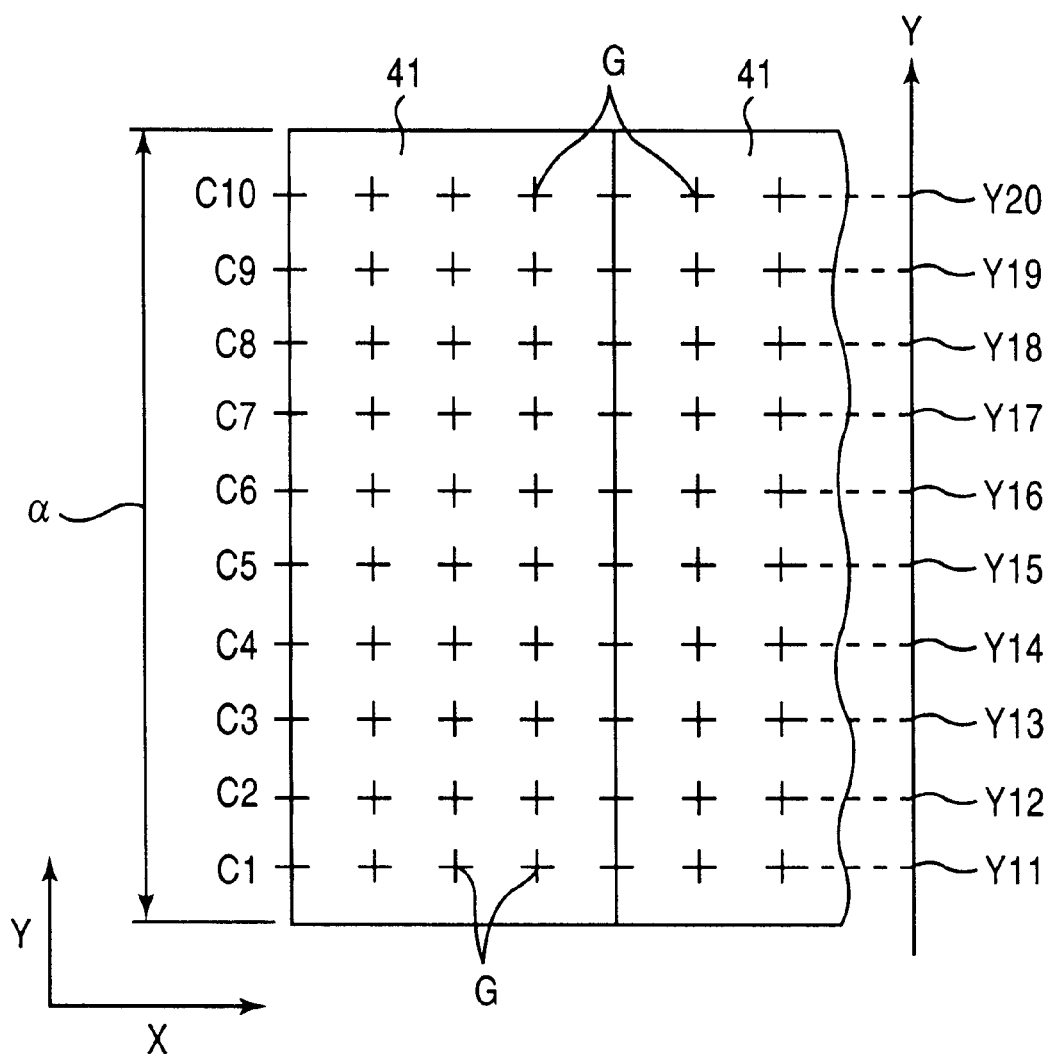
FIG. 8 is a partial plan view of a semiconductor integrated circuit device of a second embodiment of the present invention.

As shown in FIG. 8, the X-direction is the extending direction of a logic unit cell 41. In this figure, symbols "+" indicate grids G arranged in accordance with the design rule for wiring regions in the X-direction or the Y-direction. The grids G are situated in the Y-direction at coordinates Y11 to Y20. Series of grids G having the same coordinates are channels C1 to C10.

In one logic unit cell 41, connections within each basic cell 12 and between the basic cells 12 are made in a first-layer wiring region (a lower wiring layer). For example, if the first-layer wiring region is not enough to form the logic unit cell 41, a second-layer wiring regions (an upper wiring layer) 42 are used. The second-layer wiring regions 42 shown in FIGS. 9A to 9C extend in the X-direction in the logic unit cell 41. Also, the second-layer wiring regions 42 are situated at the channels C1, C5, C6, and C10. Since the second-layer wiring regions 42 are limited to these four channels, flexibility is allowed in the Y-direction, which is the long side of each basic cell 12 in each logic unit cell 41.

The order of priority is established on the four channels C1, C5, C6, and C10 for arranging the second-layer wiring regions 42. In each logic cell 41, for instance, a second-layer wiring region 42 is allocated at the channel C1, the channel C10, the channel C5, and the channel C6, in that order. In the logic unit cell 41 shown in FIG. 9A, all the four channels C1, C5, C6, and C10 are used, because four second-layer wiring regions 42 are formed. In the logic unit cell 41 shown in FIG. 9B, the channels C1 and CIO are used, because two second-layer wiring regions 42 are formed. In the logic unit cell 41 shown in FIG. 9C, the channels C1, C5, and C10 are used, because three second-layer wiring regions 42 are formed.

Figure 9A:
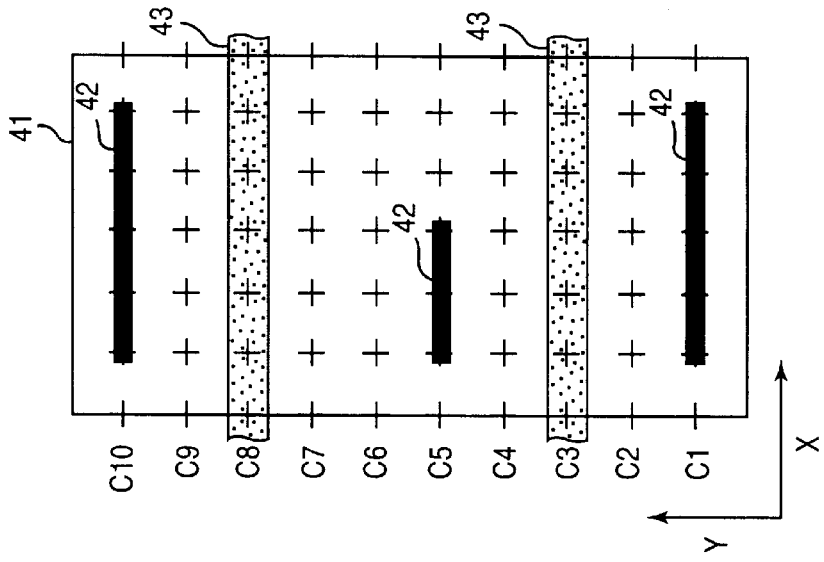
FIGS. 9A to 9C are partial plan views of semiconductor integrated circuit devices of the second embodiment of the present invention.
Figure 9B:
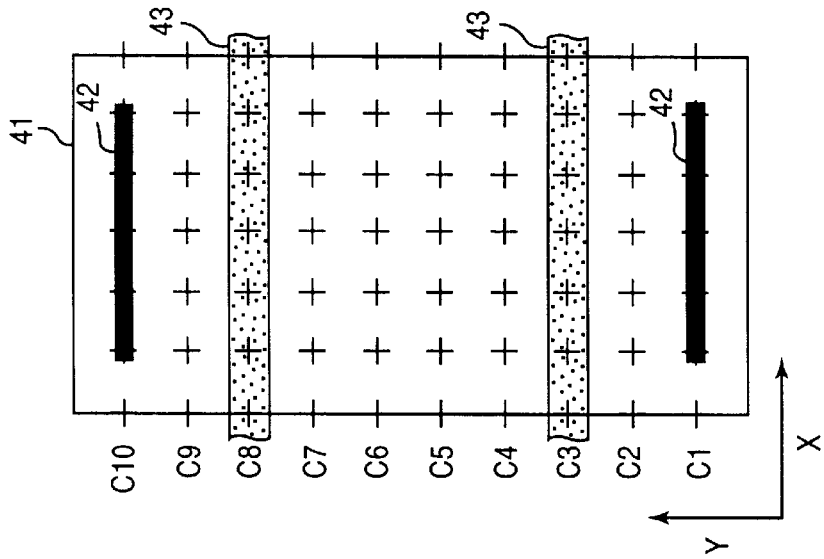
Figure 9C:
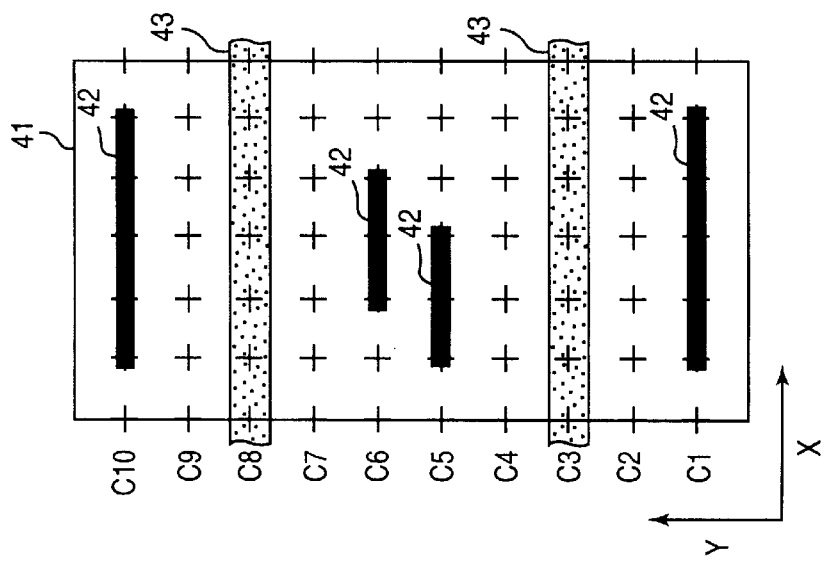

Meanwhile, in a case where two logic unit cells 41 adjacent to each other in the X-direction are to be connected, second-layer wiring regions (the upper wiring layer) 43 extending across the logic unit cells 41 in the X-direction shown in FIGS. 9A to 9C are employed. The second-layer wiring regions 43 are allocated at the channels C2, C3, C4, 7, C8, and C9. For instance, in the logic unit cell 41 shown in FIG. 9A, the channels C1, C5, C6, and C10 are already occupied, because four second-layer wiring regions 42 are formed. Accordingly, the second-layer wiring regions 43 connecting logic unit cells 41 are formed at the remaining channels C2, C3, C4, C7, C8, and C9.

As well as the same effects of the first embodiment, the second embodiment has further effects as follows.

1) In this embodiment, the second-layer wiring regions 42 making connections within each logic unit cell 41 are formed at the channels C1, C5, C6, and C10. These channels are used in the order of C1, C10, C5, and C6. Accordingly, it is easy to judge whether the channels C1, C5, C6, and C10 are used or not from the order of priority. Thus, the second-layer wiring regions 43 connecting a plurality of logic unit cells 41 can be easily arranged at the remaining channels among the C1 to C10. The workability in designing the semiconductor integrated circuit device 11 can thus be remarkably improved.

The present invention is not limited to the first and second embodiments, and modification can be made to the embodiments as follows.

Although the second-layer wiring region 31 making connections within each logic unit cell 21 is fixed at the coordinate Y3 in the first embodiment, it can be fixed at any one of the other coordinates Y1, Y2, Y4, and Y5.

Although the order of priority is C1, C10, C5, and C6 in the second embodiment, the order of priority can be changed.

Although the second-layer wiring regions 42 making connections within each logic unit cell 41 are situated only at the channels C1, C5, C6, and C10 in the second embodiment, the combination of channels can be changed. Also, the number of channels allocated to the second-layer wiring regions 42 is 2 to 9. In any case, the order of priority is established on the channels.

Figure 10:
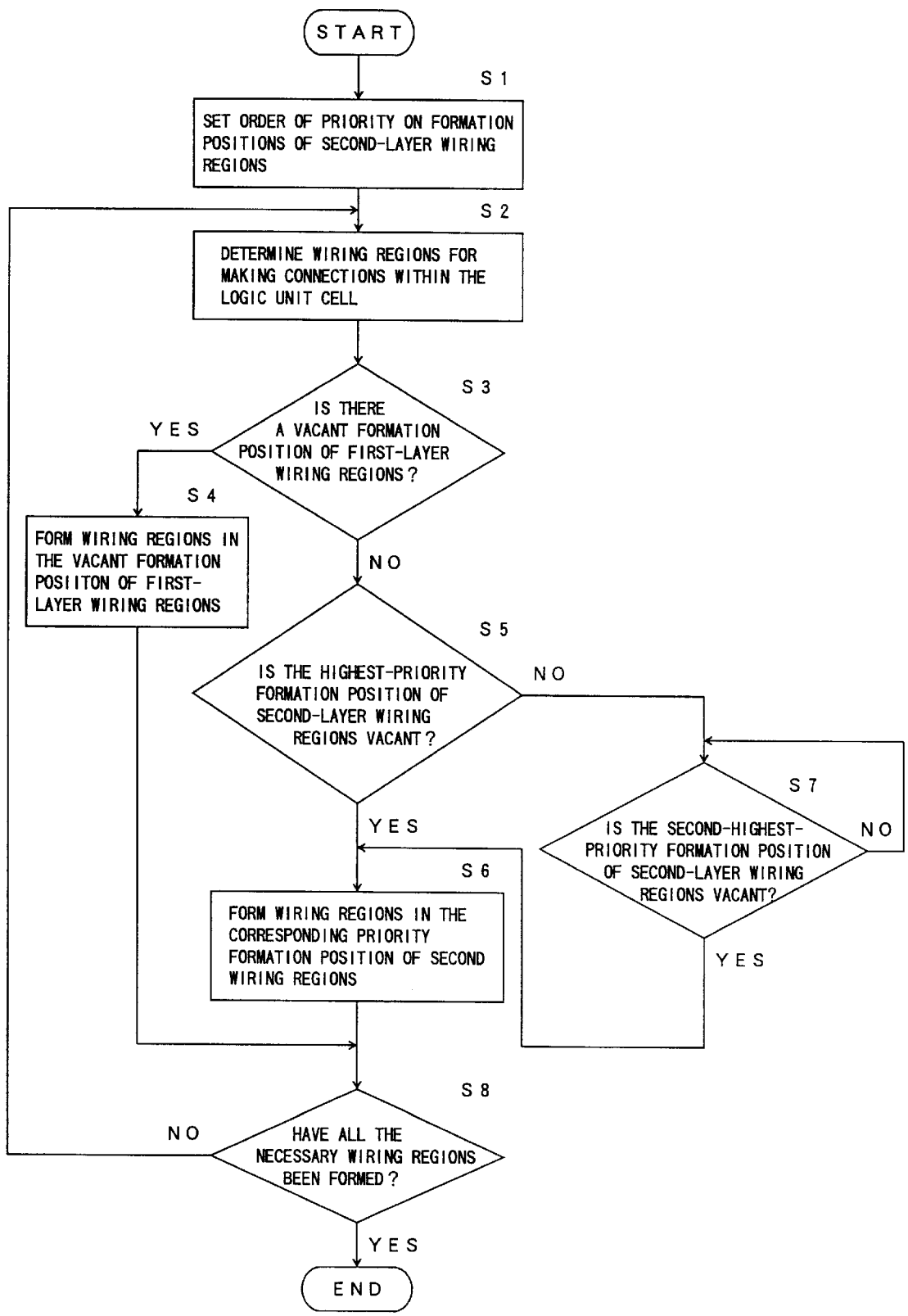
FIG. 10 is a flowchart of producing a semiconductor integrated circuit device of a third embodiment of the present invention.

FIG. 10 is a flowchart of a third embodiment of the present invention. This embodiment is a method of producing a semiconductor integrated circuit device of the present invention. The flowchart of FIG. 10 shows the features of this embodiment, and the other steps that are not shown in FIG. 10 should be considered to be apparent to those skilled in the art.

First, the order of priority is established on a plurality of second-layer wiring regions forming positions (channels) in step S5. The second-layer wiring regions connect basic cells within a logic unit cell, and correspond to the second-layer wiring regions 42 of the second embodiment, for instance. Likewise, the second-layer wiring region forming positions are equivalent to the channels C1, C5, C6, and C10 of the second embodiment.

Wiring regions connecting within the logic unit cell are determined in step S2. Whether the forming position for a first-layer wiring region is vacant or not is judged in step S3. If it is, the first-layer wiring region is formed at the vacant forming position in step S4. If it is not vacant, whether the forming position for a second-layer wiring region is vacant or not is judged in step S5. If it is, the second-layer wiring region is formed at the second-layer wiring region forming position in step S6. If it is not vacant, whether the forming position for a next wiring region is vacant or not is judged in step S7.

If the forming position for the next wiring region is vacant, the next wiring region is formed in the forming position in step S6. If the forming position for the next wiring region is not vacant, whether the forming position for a further next wiring region is vacant or not is judged in step S7.

After the above procedures, it is judged in step S8 whether all the necessary wiring regions have been formed or not. If all the necessary wiring regions have not been formed, the operation returns to step S2, and steps S3 to S8 are repeated. If all the necessary wiring regions have been completed, the operation moves on to a next step.

In this embodiment, the direction of forming the second-layer wiring regions can be either the same as the extending direction of the basic cells as in the second embodiment, or a direction perpendicular to the extending direction of the basic cell as in the prior art.

With the method of this embodiment, the following effects can be expected.

1) In this embodiment, the second-layer wiring region forming positions (channels) are used in the order of priority, and the second-layer wiring regions making connections within each logic unit cell are formed in the second-layer wiring region forming positions in the order of priority. In this manner, whether each of the second-layer wiring channels is used or not can be easily recognized. Thus, channels for the second-layer wiring regions can be easily determined. Thus, the workability in designing the semiconductor integrated circuit device of the present invention can be greatly improved.

2) Since the second-layer wiring regions are formed in the extending direction of the basic cells in this embodiment, more flexibility can be allowed to the second-layer wiring regions when a plurality of logic unit cells can be formed in the extending direction of the basic cells.

Figure 11:
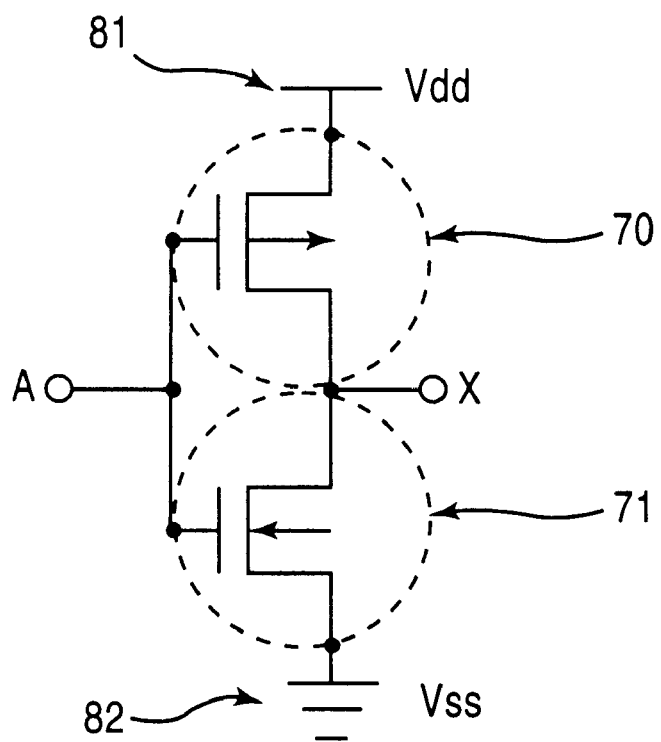
FIG. 11 is a circuit diagram showing transistors which constitute a basic cell.

FIG. 11 is a circuit diagram of transistors which are a part of a basic cell 12 (52). This circuit diagram corresponds to the pair of the p-channel MOS transistor 56 and the n-channel MOS transistor 58 or the other pair of the p-channel MOS transistor 57 and the n-channel MOS transistor 59 shown in FIG. 7.

As shown in FIG. 11, when a voltage is applied to an input terminal A, a power source voltage Vdd indicated by reference numeral 81 is applied to an output terminal X via a p-channel MOS transistor 70. When the voltage application to the input terminal A is stopped, a ground voltage Vss indicated by reference numeral 82 is applied to the output terminal X via an n-channel MOS transistor 71.

Figure 12:
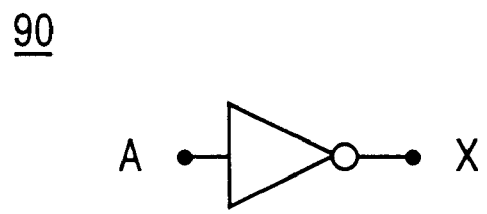
FIG. 12 is a logic symbol of an inverter circuit made up of the transistors of FIG. 11.

FIG. 12 is a logic symbol of an inverter circuit 90 formed by the transistor circuit shown in FIG. 11. When a signal is supplied to the input terminal A, an inversion of the signal is obtained at the output terminal X.

Figure 13A:
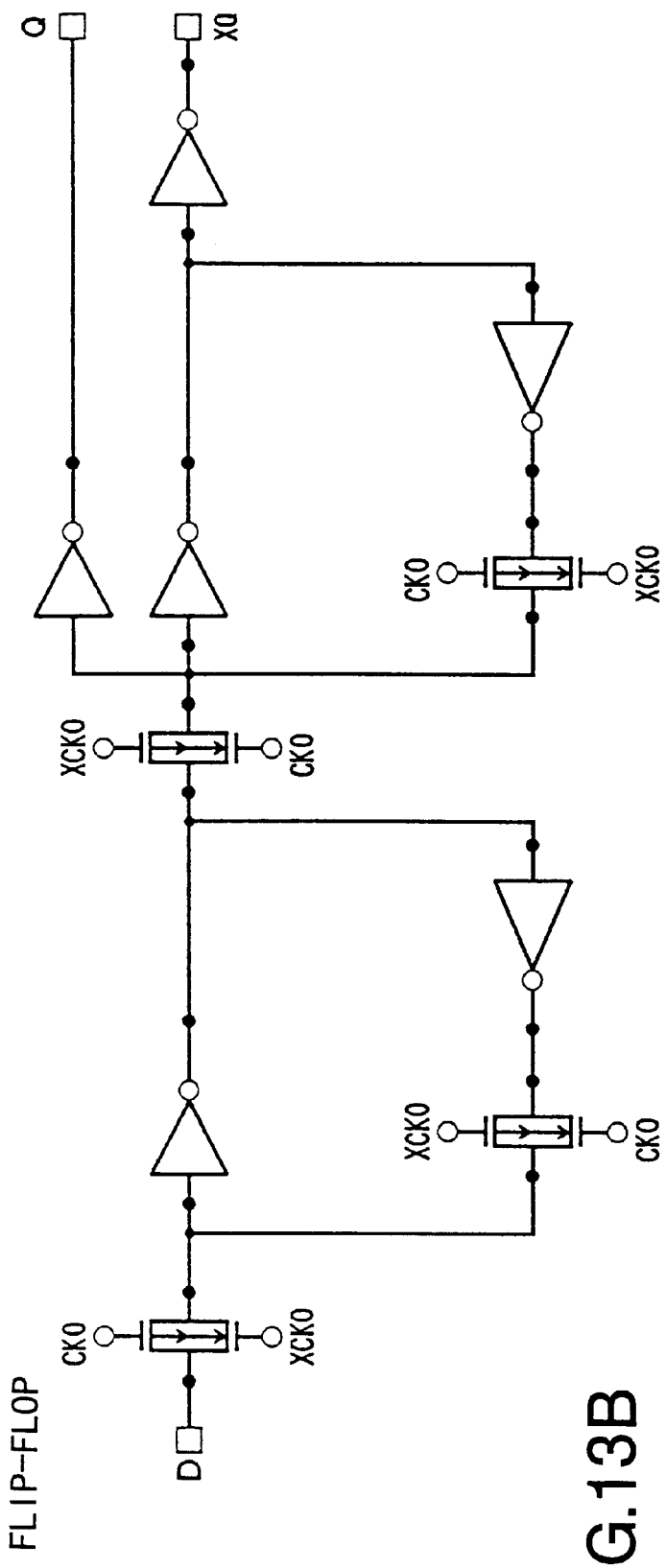
FIG. 13A is a logic symbol circuit diagram of a flip-flop as an example logic unit cell.
Figure 13B:
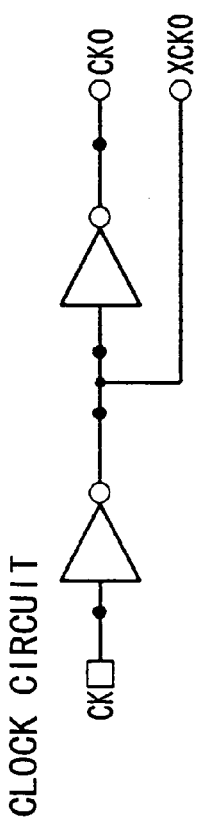
FIG. 13B is a circuit diagram of a clock circuit for the flip-flop of FIG. 13A.

FIG. 13A is a circuit diagram of a 1-bit D-type flip-flop using the inverter circuit 90. This D-type flip-flop is an example of the logic cells 21, 41, and 61. FIG. 13B shows a clock circuit for the D-type flip-flop.

As shown in FIG. 13A, the D-type flip-flop is provided with two latch circuits. In this figure, "D" indicates the input terminal of the flip-flop, "Q" indicates the output terminal of the flip-flop, "CK" indicates the clock input terminal of the flip-flop, "CKO" indicates the clock output terminals, and "XCKO" indicates the clock reverse output terminals.

Figure 14:
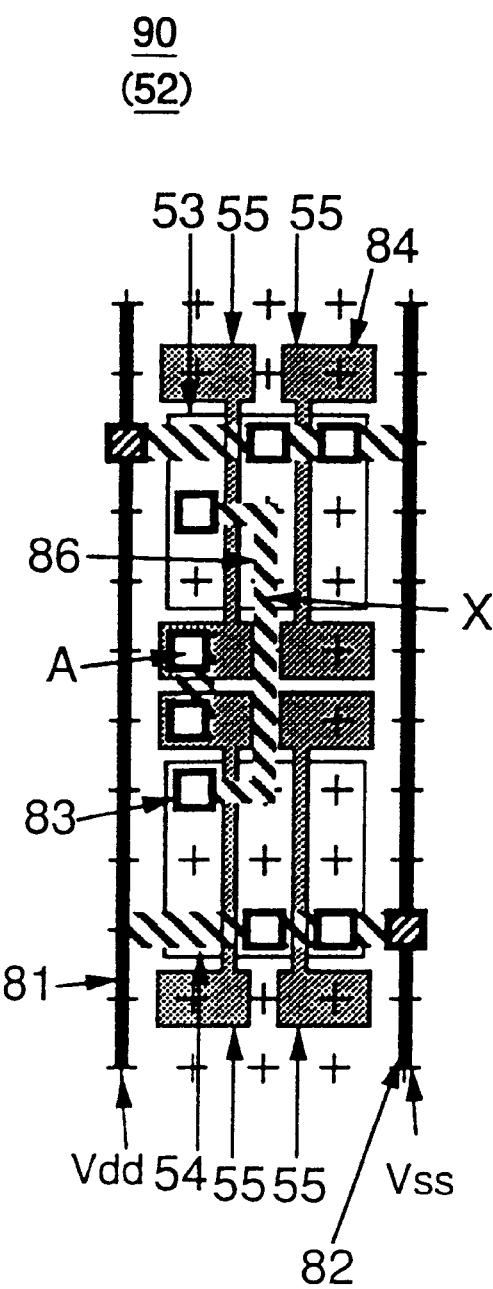
FIG. 14 shows a conventional wiring pattern of an inverter circuit as an example basic cell.

FIG. 14 shows a conventional wiring pattern which forms the inverter circuit 90 shown in FIG. 12, i.e., a wiring pattern in the basic cell 52. In this figure, reference numeral 83 indicates contacts between diffused regions or polycrystalline silicon and first or second wiring regions. Reference numeral 84 indicates vias connecting first-layer wiring regions and second-layer wiring regions 71. As mentioned before, the P⁺-type diffused regions 53, the N⁺-type diffused regions 54, and the gate electrodes 55 are formed on the substrate.

The wiring regions 81 and 82 (the power source voltage Vdd and the ground voltage Vss) extending in the Y-direction in FIG. 14 constitute a part of second-layer wiring regions 76 connecting logic unit cells 61. In this case, the first-layer wiring regions (indicated by hatched heavy lines in FIG. 14) serve as connections between the gate electrodes 55, between the drains of the P⁺-type diffused regions 53 and the N⁺-type diffused regions 54, or between the sources of the P⁺-type diffused regions 53 and the N⁺-type diffused regions 54. In FIG. 14, the second-layer wiring regions 71 making connections in the logic unit cells 61 are not formed.

Figure 15:
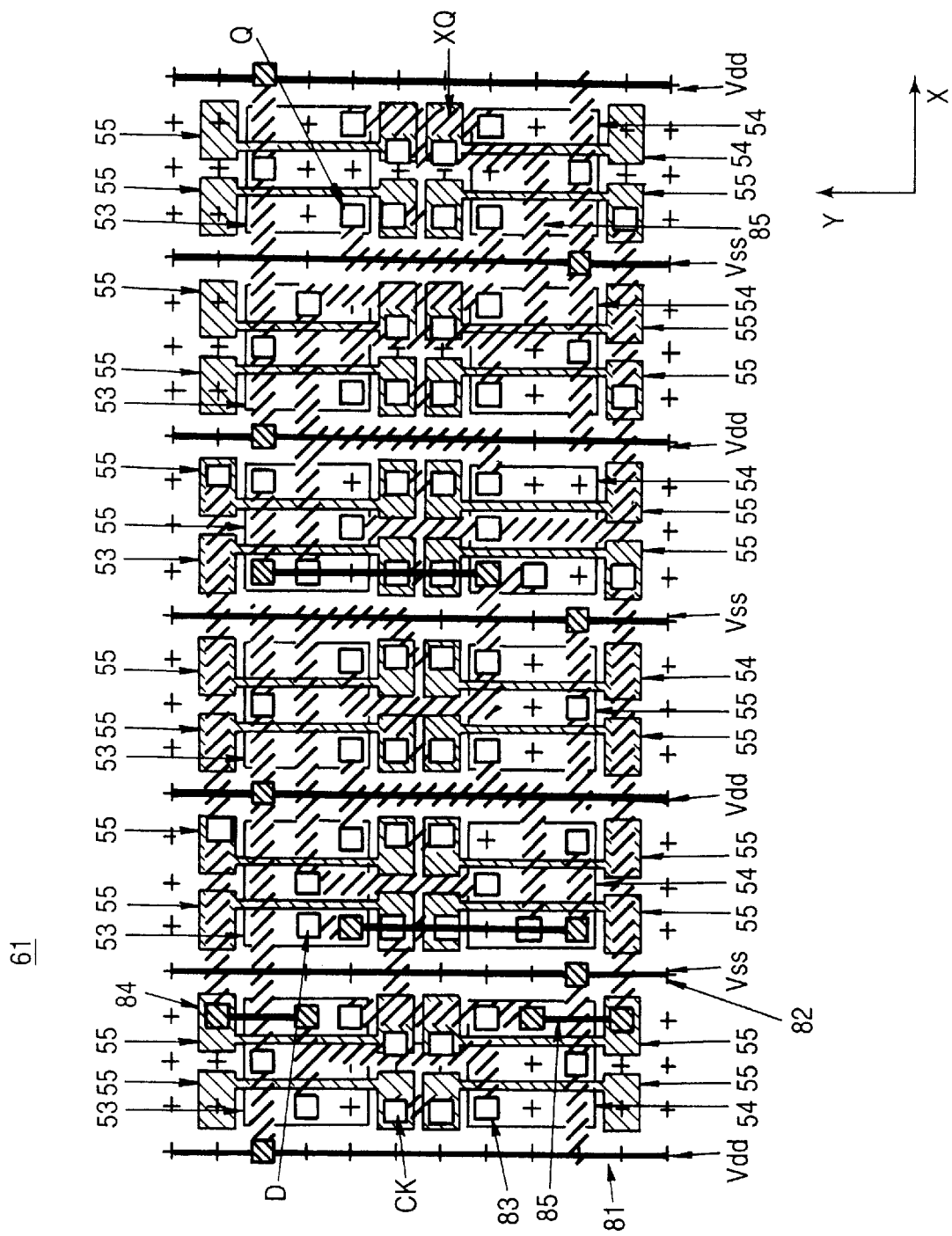
FIG. 15 shows a conventional wiring pattern of a flip-flop as an example logic unit cell.

FIG. 15 shows a conventional wiring pattern for forming the flip-flop of FIG. 13A, i.e., the wiring pattern in the logic unit cell 61. In this figure, the logic unit cell 61 contains six inverter circuits 90 (basic cells 52) extending in the X-direction. Here, the second-layer wiring regions 71 making connections in the logic unit cell 61 (shown by solid heavy lines, one of which is denoted by reference numeral 85) extend in the Y-direction and serve as connections between the gate electrodes 55 and the drains of the P⁺-type diffused regions 53 or the N⁺-type diffused regions 54, or between the drains of the P⁺-type diffused regions 53 and the sources of the N⁺-type diffused regions 54.

Figure 16:
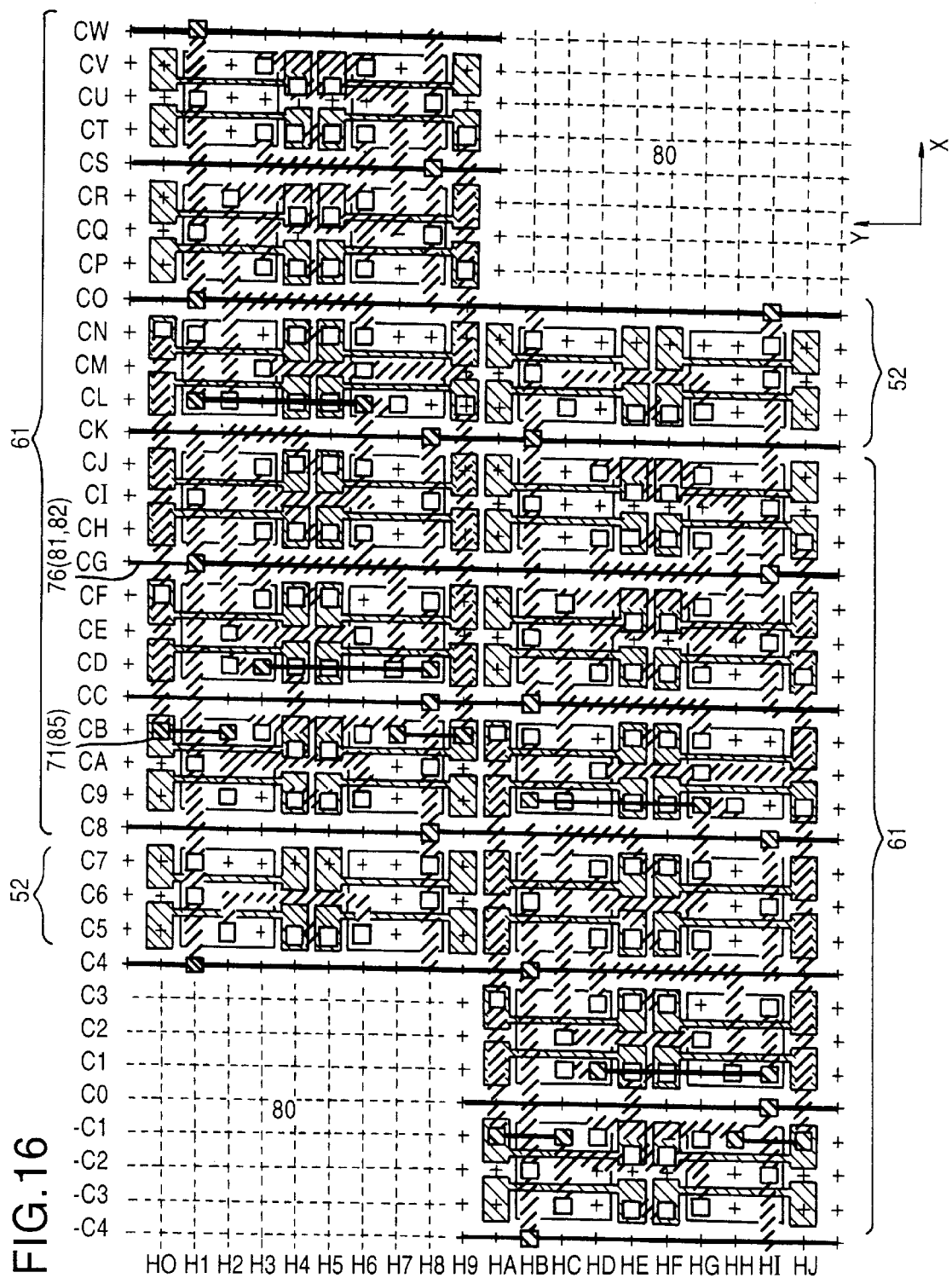
FIG. 16 shows a conventional wiring pattern of two logic unit cells of FIG. 15 extended in the Y-direction.

FIG. 16 shows a case where two logic unit cells 61 of FIG. 15 are arranged in the Y-direction.

The second-layer wiring regions 71 making connections in each of the logic unit cells 61 extend in the Y-direction, but are situated in different positions in the X-direction (channels -C4 to C9 and CA to CW). To prevent the second-layer wiring regions 76 (81 and 82) from overlapping with the second-layer wiring regions 71, the two logic unit cells 61 are shifted from each other by two basic cells 52. As a result, idle spaces 80 which are not used as logic unit cells are formed. In FIG. 16, two inverter circuits 90 of FIG. 14 are formed in a rectangle having a diagonal line passing through coordinates (H0, C4) and (H9, C8), and in a rectangle having a diagonal line passing through coordinates (HA, CK) and (HJ, CO). Meanwhile, two flip-flops 61 (i.e., logic unit cells 61) of FIG. 15 are formed in a rectangle having a diagonal line passing through coordinates (H0, C8) and (H9, CW), and in a rectangle having a diagonal line passing through coordinates (HA,-C4) and (HJ, CK). Also, the second-layer wiring regions 76 (81 and 82) connect the two logic unit cells 61.

In a rectangle having a diagonal line passing through coordinates (H0, C8) and (HJ, CC) in FIG. 16, three second-layer wiring regions 71 making connection within the flip-flops 61 are already formed between coordinates (HB, C9) and (HG, C9), between coordinates (H0, CB) and (H2, CB), and between coordinates (H7, CB) and (H9, CB). Among the five X-coordinate channels C8, C9, CA, CB, and CC, four X-coordinate channels C8, C9, CB, and CC are already provided with the second-layer wiring regions 71 and 76. Accordingly, a new second-layer wiring region 76 can be formed only at the X-coordinate CA. This proves that the wiring arrangement does not have great flexibility.

Although the two logic unit cells are shifted from each other in the X-direction by two basic cells in FIG. 16, it is also possible to form the two logic unit cells 61 at the same X-coordinates, with the second-layer wiring regions 71 being formed at the same X-coordinates. An example of this is a case where the lower logic unit cell 61 in FIG. 16 is situated in a rectangle having a diagonal line passing through coordinates (HA, C8) and (HJ, CW), and the second-layer wiring regions 71 making connections within the logic unit cell 61 are formed between coordinates (HB, C9) and (HG, C9), between coordinates (H0, C9) and (H2, C9), and between coordinates (H7, C9) and (H9, C9). In this case, a new second-layer wiring region 76 can be formed at either the X-coordinate CA or CB. This means that compared with the example shown in FIG. 16, such a wiring pattern has higher flexibility. However, it is apparent that such a case rarely occurs.

Figure 17:
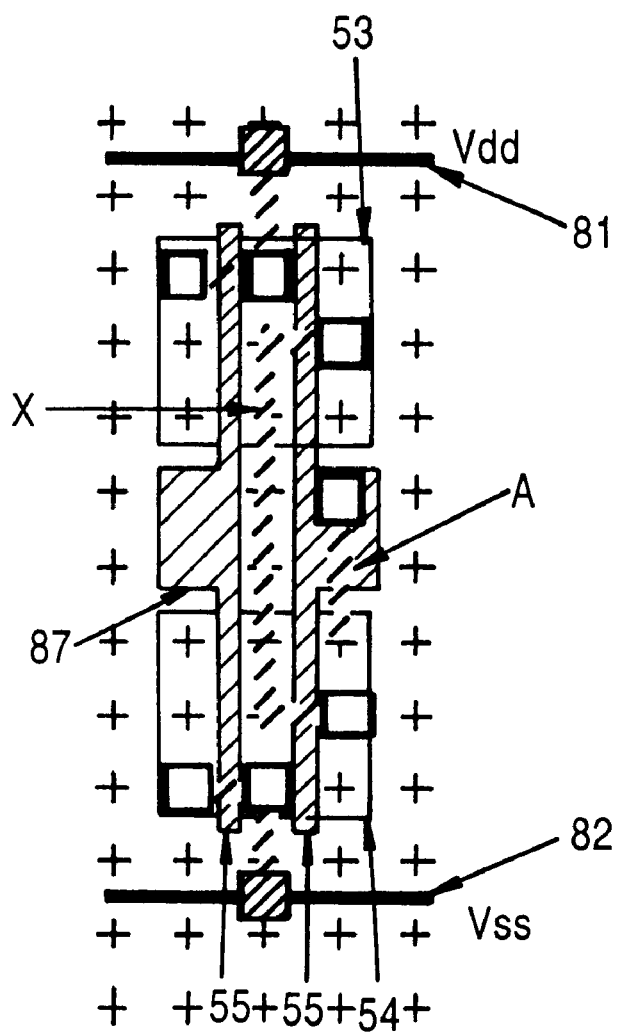
FIG. 17 shows a wiring pattern of an inverter circuit as an example basic cell of the present invention.
Figure 18:
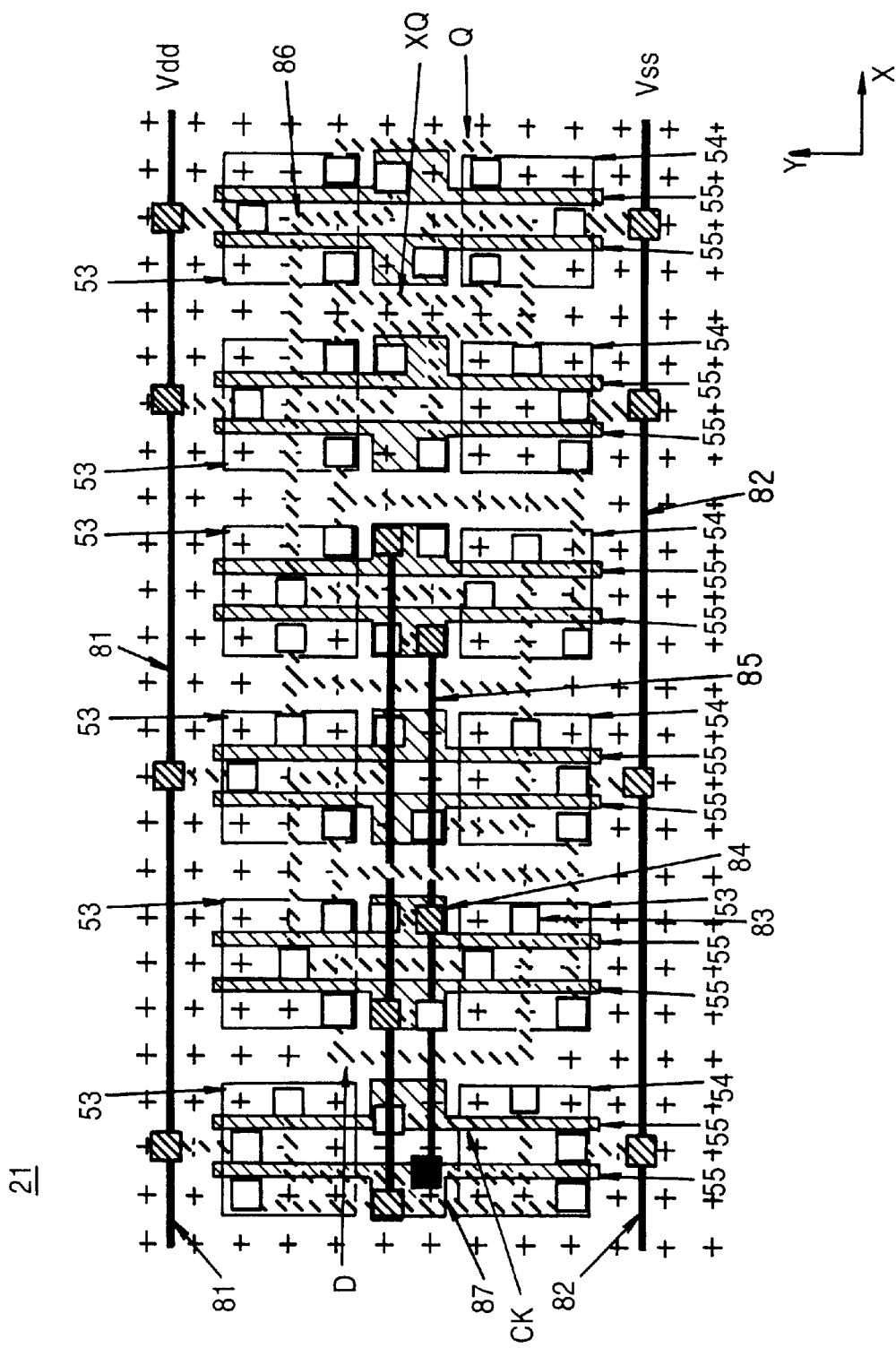
FIG. 18 shows a wiring pattern of a flip-flop as an example logic unit cell of the present invention.
Figure 19:
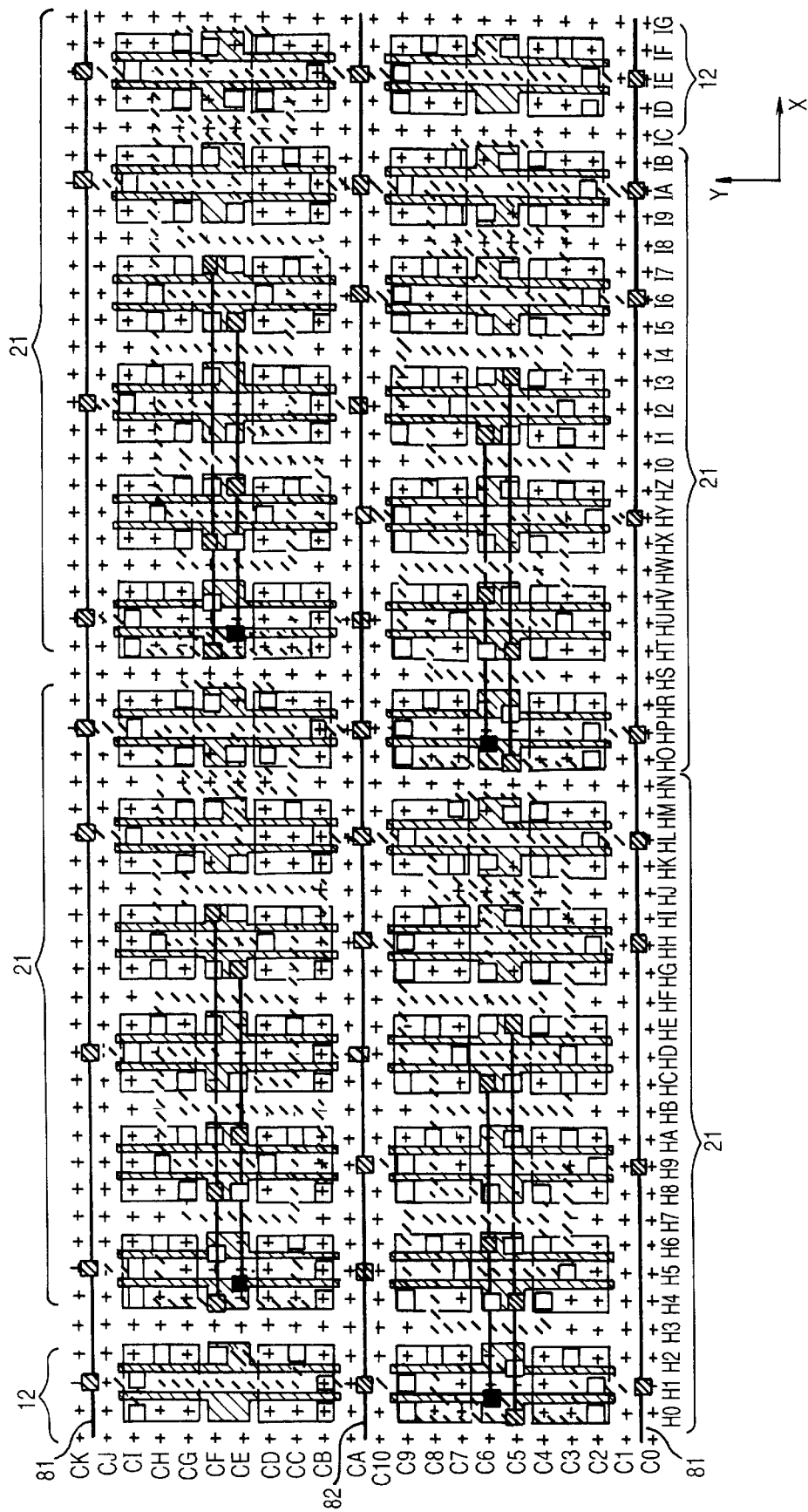
FIG. 19 shows a wiring pattern of logic unit cells of FIG. 18 extended in the X-direction and also aligned in the Y-direction.

Referring now to FIGS. 17 to 19, wiring patterns of the present invention will be described. In these figures, the same components as in FIGS. 14 to 16 are indicated by the same reference numerals.

FIG. 17 shows a wiring pattern of the inverter circuit 90 shown in FIG. 12, i.e., an example wiring pattern of a basic cell 12. In this figure, reference numeral 87 indicates a contact between a diffused region and a first-layer wiring region or a second-layer wiring region, and a via connecting a first-layer wiring region to a second-layer wiring region. Here, the wiring regions 81 and 82 that serve as the power source voltage Vdd and the ground voltage Vss are formed in the X-direction, and constitute a part of second-layer wiring regions 32 and 43 connecting logic unit cells 21. In this figure, the second-layer wiring regions 31 making connections within each logic unit cell 21 are not shown.

FIG. 18 shows a wiring pattern of the flip-flop of the present invention shown in FIG. 13, i.e., a wiring pattern in a logic unit cell 21.

In FIG. 18, the logic unit cell 21 is formed by six basic cells 12 of FIG. 17 aligned in the X-direction. Here, the second-layer wiring regions 31 making connections within the logic unit cell 21 are shown by solid heavy lines, one of which is denoted by reference numeral 85. The second-layer wiring regions 31 extend in the X-direction to connect a plurality of gate electrodes 55.

FIG. 19 shows a wiring pattern in which two logic unit cells 21 of FIG. 18 are arranged in the X-direction and two sets of such two logic unit cells 21 are arranged in the Y-direction. In this case, a second-layer wiring region 82 as a ground voltage Vss is shared by the upper and lower sets of logic unit cells 21. Since the logic unit cells 21 are extended in the X-direction, there is no need to form a second-layer wiring region for connecting the upper and lower logic unit cells 21. Accordingly, about the upper and lower logic unit cells 21 can be continuously formed in the X-direction, without requiring the idle spaces as in the conventional case shown in FIG. 16. Unlike in the second embodiment, the channel C5 has higher priority over the channel C6 for forming the second-layer wiring regions 31 for making connections within each logic unit cell 21.

As can be seen from FIG. 19, the second-layer wiring regions 31 are already formed only at the Y-coordinates (channels) C5 and C6 among the ten channels C1 to C10 in the lower flip-flops 21. Accordingly, eight channels C1 to 4 and C7 to C10 are available for forming second-layer wiring regions for connecting the logic unit cells 21. Thus, the flexibility in wiring can be remarkably improved.

The present invention is not limited to the specifically disclosed embodiments, but variations and modifications may be made without departing from the scope of the present invention.

The present application is based on Japanese priority applications No. 10-348188, filed on Dec. 8, 1998, and No. 11-287102, filed on Oct. 7, 1999, the entire contents of which are hereby incorporated for reference.

What is claimed is:

1. A semiconductor integrated circuit device comprising:

basic cells in a lattice arrangement having an extending direction;

a logic unit cell formed by the basic cells in the extending direction; and a second-layer wiring region formed in the extending direction for making connection within the logic unit cell and located at a predetermined position along a direction perpendicular to the extending direction.

2. The semiconductor integrated circuit device as claimed in claim 1, wherein:

the second-layer wiring regions are formed in a plurality of positions among the predetermined positions.

3. A semiconductor integrated circuit device comprising:

basic cells in a lattice arrangement having an extending direction;

a logic unit cell formed by the basic cells in the extending direction; and a second-layer wiring region formed in the extending direction for making connection within each of the logic unit cells and located at a predetermined position along a direction perpendicular to the extending direction.

4. The semiconductor integrated circuit device as claimed in claim 3, wherein:

the second-layer wiring regions are formed in a plurality of positions among the predetermined positions.

5. A semiconductor integrated circuit device comprising:

basic cells in a lattice arrangement having an extending direction;

a logic unit cell each formed by the basic cells in the extending direction;

a second-layer wiring region formed only in the extending direction for making connection within each of the logic unit cells and located at a predetermined position along a direction perpendicular to the extending direction; and a second-layer wiring region formed only in the extending direction for making connection within the logic unit cells and situated in positions except for the predetermined positions of the second-layer wiring regions for making connection within each of the logic cells.

6. The semiconductor integrated circuit device as claimed in claim 5, wherein:

the second-layer wiring regions are formed in a plurality of positions among the predetermined positions.

* * * * *